(12) United States Patent
Waldrop

(10) Patent No.: US 6,885,226 B2
(45) Date of Patent: Apr. 26, 2005

(54) PROGRAMMABLE DUAL-DRIVE STRENGTH OUTPUT BUFFER WITH A SHARED BOOT CIRCUIT

(75) Inventor: William C. Waldrop, Plano, TX (US)

(73) Assignee: Micron Technology, Inc., Boise, ID (US)

(*) Notice: Subject to any disclaimer, the term of this patent is extended or adjusted under 35 U.S.C. 154(b) by 41 days.

(21) Appl. No.: 10/431,161

(22) Filed: May 6, 2003

(65) Prior Publication Data
US 2003/0201804 A1 Oct. 30, 2003

Related U.S. Application Data

(62) Division of application No. 09/808,739, filed on Mar. 15, 2001, now Pat. No. 6,559,690.

(51) Int. Cl.[7] .................................................. H03K 3/00
(52) U.S. Cl. ........................... 327/112; 327/390; 326/85
(58) Field of Search .......................... 327/108–112, 390, 327/536, 333, 545; 326/82–87, 80, 81, 26, 27

(56) References Cited

U.S. PATENT DOCUMENTS

| | | | |
|---|---|---|---|
| 5,128,560 A | 7/1992 | Chern et al. | 326/81 |
| 5,128,563 A | 7/1992 | Hush et al. | 326/87 |
| 5,150,186 A | 9/1992 | Pinney et al. | 326/87 |
| 5,165,046 A | 11/1992 | Hesson | 327/111 |
| 5,274,276 A | 12/1993 | Casper et al. | 326/21 |
| 5,319,258 A * | 6/1994 | Ruetz | 326/21 |
| 5,329,186 A | 7/1994 | Hush et al. | 326/88 |
| 5,331,593 A | 7/1994 | Merritt et al. | 365/189.11 |
| 5,347,179 A | 9/1994 | Casper et al. | 326/122 |
| 5,349,247 A | 9/1994 | Hush et al. | 326/88 |
| 5,367,205 A | 11/1994 | Powell | 326/27 |
| 5,387,824 A | 2/1995 | Michelsen | 326/83 |
| 5,497,105 A | 3/1996 | Oh et al. | 326/27 |
| 5,574,390 A | 11/1996 | Thomann | 326/88 |
| RE35,764 E | 4/1998 | Casper et al. | 326/122 |
| 5,783,948 A | 7/1998 | Thomann et al. | 326/88 |
| 5,802,009 A | 9/1998 | Casper et al. | 365/230.06 |
| 5,838,177 A | 11/1998 | Keeth | 327/108 |
| 5,850,159 A | 12/1998 | Chow et al. | 327/394 |
| 5,852,378 A | 12/1998 | Keeth | 327/171 |
| 5,864,506 A * | 1/1999 | Arcoleo et al. | 365/189.05 |
| 5,877,647 A * | 3/1999 | Vajapey et al. | 327/391 |
| 5,914,898 A | 6/1999 | Sher et al. | 365/189.05 |
| 5,917,758 A | 6/1999 | Keeth | 365/189.05 |
| RE36,264 E | 8/1999 | Merritt et al. | 365/189.11 |
| 5,940,320 A | 8/1999 | Casper et al. | 365/185.11 |
| 5,945,845 A | 8/1999 | Thomann et al. | 326/88 |
| 5,949,254 A | 9/1999 | Keeth | 326/87 |
| 5,966,036 A | 10/1999 | Hoff et al. | 327/112 |
| 6,037,803 A | 3/2000 | Klein | 326/86 |
| 6,040,714 A | 3/2000 | Klein | 326/86 |
| 6,055,191 A | 4/2000 | Sher et al. | 365/189.05 |
| 6,069,504 A | 5/2000 | Keeth | 327/108 |
| 6,069,510 A | 5/2000 | Keeth | 327/170 |
| 6,072,729 A | 6/2000 | Casper | 365/189.05 |
| 6,084,434 A | 7/2000 | Keeth | 326/87 |
| 6,097,223 A | 8/2000 | Loughmiller | 327/112 |
| 6,118,310 A * | 9/2000 | Esch, Jr. | 327/108 |
| 6,141,263 A | 10/2000 | Protzman | 365/189.11 |
| 6,285,215 B1 | 9/2001 | Voshell | 326/86 |

(Continued)

Primary Examiner—Minh Nguyen
(74) Attorney, Agent, or Firm—Schwegman, Lundberg, Woessner & Kluth, P.A.

(57) ABSTRACT

An integrated circuit device is discussed that includes a data output driver having two modes of operation for driving a data bus. The output driver includes a circuit to produce a full drive output high signal, a partial drive output high signal, a full drive output low signal and a partial drive output low signal. The output driver is protected against negative voltages on the data bus. The output driver is selectable and adaptable to drive terminated loads and unterminated loads.

33 Claims, 11 Drawing Sheets

U.S. PATENT DOCUMENTS

| | | | |
|---|---|---|---|
| 6,292,407 B1 | 9/2001 | Porter et al. | 365/189.11 |
| 6,307,414 B1 | 10/2001 | Hoff | 327/170 |
| 6,351,172 B1 * | 2/2002 | Ouyang et al. | 327/333 |
| 6,538,464 B1 * | 3/2003 | Muljono et al. | 326/27 |
| 6,654,310 B1 * | 11/2003 | Nam | 365/230.06 |

* cited by examiner

US 6,885,226 B2

PROGRAMMABLE DUAL-DRIVE STRENGTH OUTPUT BUFFER WITH A SHARED BOOT CIRCUIT

This application is a divisional of U.S. application Ser. No. 09/808,739 filed Mar. 15, 2001, now U.S. Pat. No. 6,559,690, which is incorporated herein by reference.

TECHNICAL FIELD

The present invention relates generally to semiconductor integrated circuits. More particularly, it pertains to enhancing outputting capability of a Synchronous Dynamic Random Access Memory (SDRAM) so as to allow the SDRAM to be adaptively compatible with different termination requirements of various types of circuits.

BACKGROUND

Memory devices are integrated circuits in which information may be stored and from which information may be extracted when desired. Each memory device is built from a plurality of memory cells. Each memory cell memorizes a bit of data. Although a bit of data seems insignificant, it may determine whether the stored information is correct, such as an amount in a checking account.

The process of memorizing the bit of data by the memory cell is an example of the ingenuity of a memory device. But also equally important is the process of extracting the memorized bit of data from the memory cell. The process of extracting outputs the memorized bit of data so that subsequent devices, which are coupled to the memory device, may make use of it.

Certain devices require that the memory device powerfully drive the memorized bit of data from the memory device to the input of those certain devices. Yet other devices, especially those used in graphics products, require a less powerful drive of the memorized bit of data. Current memory devices are unable to adapt to the needs of various devices.

Thus, what is needed are devices and methods to adapt to the needs of various devices coupled to the memory device so as to enhance the output operations of future generations of memory devices, such as synchronous DRAMs (SDRAMs), and double-data-rate SDRAMs (DDR SDRAMs).

SUMMARY

The above-mentioned problems with memory devices and other problems are addressed by the present invention and will be understood by reading and studying the following specification. Devices and methods are described which accord these benefits.

One illustrative embodiment includes an output driver having two modes of operation. The output driver includes a first circuit to support one of the two modes. One of the two modes drives a subsequent input stage of another circuit without a termination in between the output driver and the subsequent input stage of the other circuit. The output driver includes a second circuit to support the other of the two modes. The other of the two modes drives the subsequent input stage of the other circuit with the termination in between the output driver and the subsequent input stage of the other circuit.

Another illustrative embodiment includes an output driver for driving data at an output. The output driver includes a full-drive pull-up circuit to drive data high to a full level, a reduced-drive pull-up circuit to drive data high at a reduced level, a full-drive pull-down circuit to drive data low to a full level, and a reduced-drive pull-down circuit to drive data low at a reduced level.

Another illustrative embodiment includes a circuit to output data in a memory device. The circuit includes a pre-driver circuit that produces a mode selected from a group consisting of a full-drive mode and a reduced-drive mode. The circuit also includes an output driver coupled to the pre-driver circuit that outputs the data in accordance with the mode produced by the pre-driver circuit.

Another illustrative embodiment includes a circuit to output data in a memory device. The circuit includes a pre-driver circuit that produces a mode signal selected from a group consisting of a full-drive mode and a reduced-drive mode. The pre-driver circuit includes a negative protection circuit. The circuit includes an output driver coupled to the pre-driver circuit that outputs a data signal in accordance with the mode produced by the pre-driver circuit. The negative protection circuit inhibits undesired turning-on of the output driver.

Another illustrative embodiment includes a circuit to output data in a memory device. The circuit includes a pre-driver that produces a mode signal selected from a group consisting of a full-drive mode and a reduced-drive mode. The pre-driver circuit includes a booting circuit that boots a boot-up signal to a voltage level. The voltage level is selected from a regular voltage supply level or a pumped voltage supply level. The circuit includes an output driver coupled to the pre-driver circuit that outputs a data signal in accordance with the mode produced by the pre-driver circuit.

Another illustrative embodiment includes a circuit to output data in a memory device. The circuit includes a pre-driver circuit that produces a mode signal selected from a group consisting of a full-drive mode and a reduced-drive mode. The pre-driver circuit includes a reduced-drive pull-up driver so as to produce the reduced-drive mode at a reduced-drive node.

Another illustrative embodiment includes a circuit to output data in a memory device. The circuit includes a pre-driver circuit that produces a mode signal selected from a group consisting of a full-drive mode and a reduced-drive mode. The pre-driver circuit includes a full-drive pull-up driver so as to produce the full-drive mode at a full-drive node. The circuit includes an output driver coupled to the pre-driver circuit that outputs a data signal in accordance with the mode produced by the pre-driver circuit.

Another illustrative embodiment includes a circuit to output data in a memory device. The circuit includes a pre-driver circuit that produces a mode signal selected from a group consisting of a full-drive mode and a reduced-drive mode. The pre-driver circuit includes a full-drive pull-down driver so as to produce the full-drive mode at a full-drive node. The circuit includes an output driver coupled to the pre-driver circuit that outputs a data signal in accordance with the mode produced by the pre-driver circuit.

Another illustrative embodiment includes a pre-driver circuit that produces a mode signal selected from a group consisting of a full-drive mode and a reduced-drive mode. The pre-driver circuit includes a reduced-drive pull-down driver so as to produce the reduced-drive mode at a reduced-drive node. The pre-driver circuit includes an output driver coupled to the pre-driver circuit that outputs a data signal in accordance with the mode produced by the pre-driver circuit.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
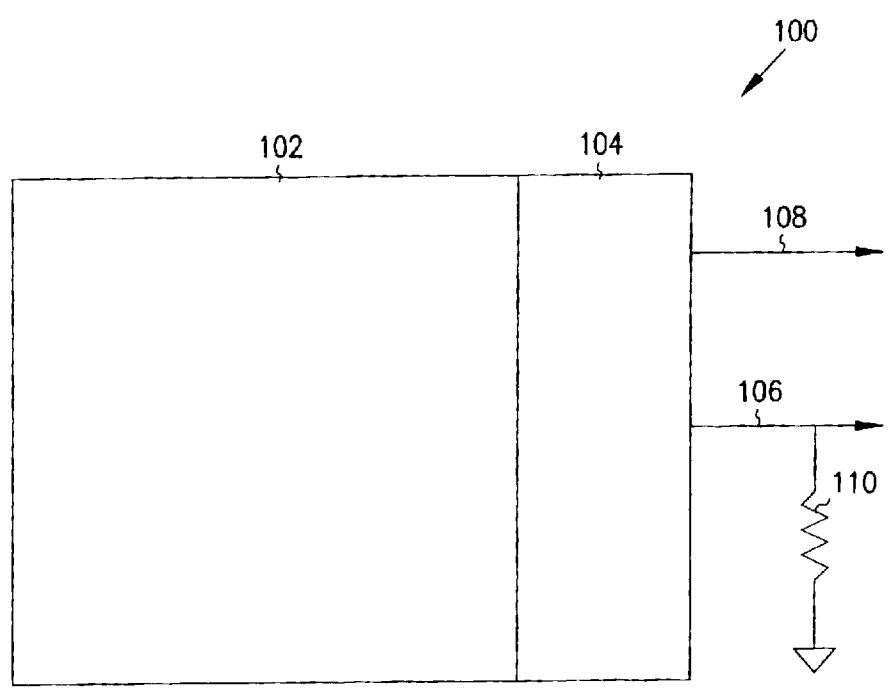
FIG. 1 is a block diagram of a memory device according to an embodiment of the invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms "high" and "low" as used herein refer to Vcc, the voltage supply, and ground, respectively. The term "external supply" as used herein refers to Vcc, the voltage supply.

FIG. 1 is a block diagram of a memory device 100 according to an embodiment of the invention. The memory device 100 includes multiple memory cells, which are organized into an array 102. Recall that each memory cell memorizes at least one bit of data. The array 102 allows easy read or write access to each memory cell in the array 102. The memory device 100 also includes an output buffer circuit 104. The output buffer 104 helps to strengthen the data signal coming out from the memory device 100 so that the strengthened data signal may enter subsequent devices without degradation. In some systems using memory devices, the output drive strength of the memory device must be substantial while in other systems, the output drive strength is less demanding. As illustrated in FIG. 1, output 108 does not require a termination impedance while output 106 requires a termination impedance 110. As such, the required output drive strength of output 106 is significantly greater than the output drive strength of output 108.

As illustrated in FIG. 1, the termination impedance 10 is required in applications that subscribe to the Stub Series-Terminated Load specification (SSTL). The SSTL interface standard is produced by the Joint Electron Devices Engineering Councils (JEDEC) and is available to the public in publications nos. JC-16-97-04 (Stub Series-Terminated Logic for 3.3 Volts) and JC-16-97-58 (Stub Series-Terminated Logic for 2.5 Volts) which are hereby incorporated by reference. The SSTL interface standard is intended for high-speed memory interface applications and specifies switching characteristics such that operating frequencies up to 200 MHZ are attainable. The primary application for SSTL devices is to interface with Synchronous Dynamic Random Access Memory (SDRAM). Part of the SSTL specification specifies a bus termination impedance of 25 to 50 ohms and a termination voltage. The termination 110 of FIG. 1 is illustrative only since the SSTL standard specifies a more detailed and particular termination scheme with appropriate values for resistors and capacitors. For example, the terminator for an SSTL bus line includes two resistors in parallel which are used to establish a voltage level approximately mid-way between Vcc and ground such that differential voltage swings can be utilized on the order of ±380 millivolts to ±400 millivolts about the midpoint voltage.

By way of example, according to the SSTL specification, in order to drive a data signal at the termination load 110, one would drive the data signal to a desired voltage above the termination voltage, which is about mid-way between Vcc and ground, to approximately +380 millivolts above the midpoint voltage for a logical ONE signal or −380 millivolts below the midpoint bus voltage for a logical ZERO signal. In the present invention, the use of SSTL to drive a data signal is considered to be a full-drive mode because the memory device 100 would more powerfully drive the data signal out of the output buffer 104 to the subsequent devices.

In other systems utilizing memory devices but not using SSTL, devices were connected directly to the output 108 of the memory device 100 without any termination. This is known as a point-to-point configuration and in some applications known as Transistor-Transistor Logic (TTL) and Low-Voltage Transistor-Transistor Logic (LVTTL). Graphics products typically use this configuration and the voltage swings on the output 110 typically swing from Vcc to Ground. This configuration, however, does not need the data signal to be as powerfully driven as in SSTL configurations. In fact, in certain cases, data that is driven powerfully in a point-to-point configuration may cause ringing and undesired noise on the bus lines.

The output buffer 104 of the present invention solves this problem by adaptively switching between full-drive mode for devices that require a more powerful drive of the data signal (such as SSTL configurations) and a reduced-drive mode for devices that require a less powerful drive of the data signal (such as LVTTL and TTL configurations). Subsequent figures discussed below expand on this in more detail.

Figure 2:
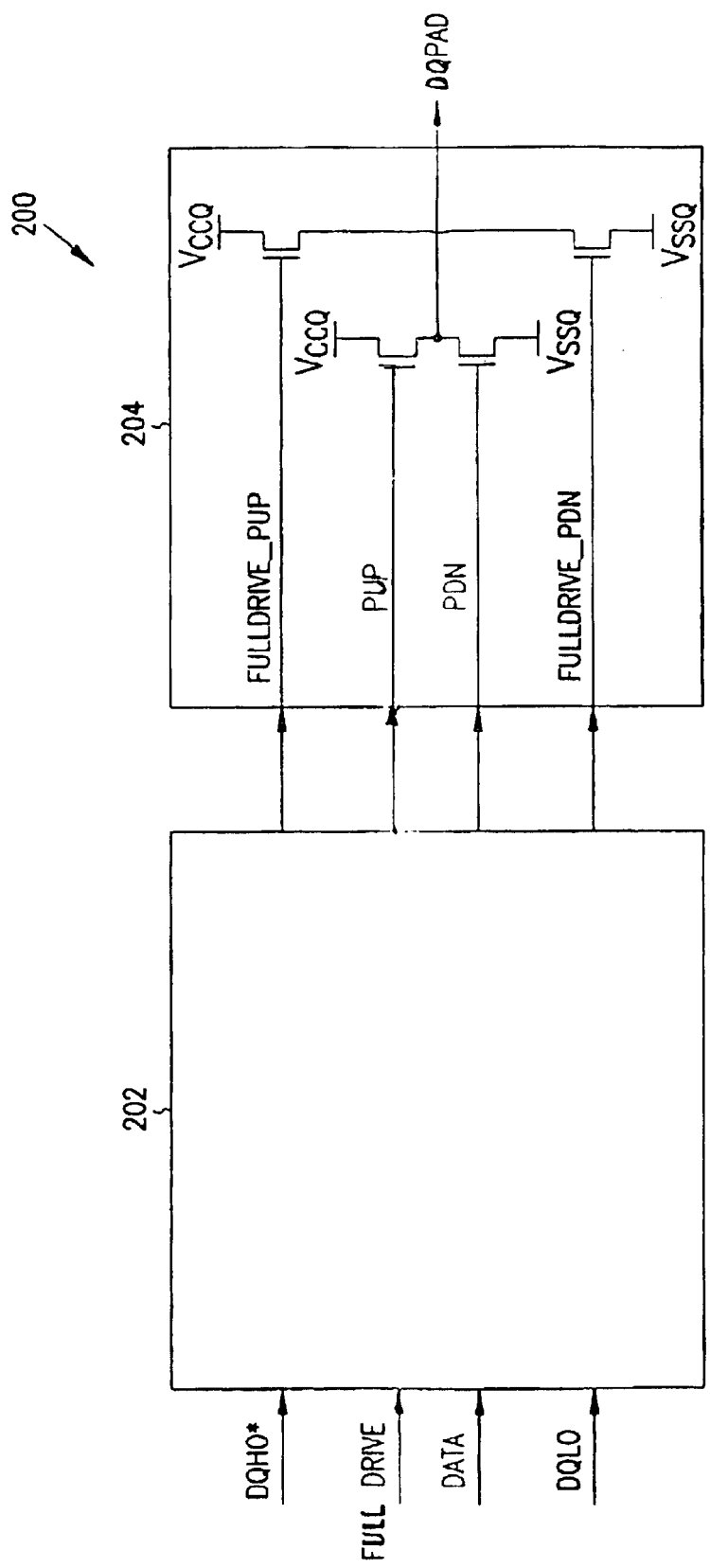
FIG. 2 is a block diagram of an output buffer circuit of a memory device according to an embodiment of the invention.

FIG. 2 is a block diagram of an output buffer circuit for a single output data pin of a memory device according to an embodiment of the invention. An output buffer 200 may be organized into two separate circuits: a pre-driver circuit 202 and an output driver 204.

The pre-driver circuit 202 receives the data from the memory array. The pre-driver circuit 202 also receives drive information on whether full-drive or reduced-drive is desired on the output DQPAD. Based on the level of the data (high or low) and the drive information, the pre-driver circuit 202 produces data signals for the output driver 204 to process. The output driver 204 drives the data signals according to the appropriate mode out of the memory device.

Output driver circuit 204 of FIG. 2 includes is a simplified DQ pad schematic which illustrates the operation of the dual-drive output. The output driver circuit 204 receives four main signals from the pre-driver circuit 202. The FULLDRIVE_PUP signal is used to indicate when the output is to produce a full-drive pull-up signal for an SSTL load. When used alone, the PUP signal is used to produce a reduced-drive or half-drive signal for a non-SSTL load such as LVTTL. If an SSTL load is to be driven high, the output buffer circuit 204 receives both the active drive signals from FULLDRIVE_PUP and PUP. If only a conventional reduced-drive load is to be driven high, the output buffer circuit 204 receives only the active drive signal from PUP.

The FULLDRIVE_PDNx signal is used to indicate when the output is to produce a full-drive pull-down signal for an SSTL load. When used alone, the PDNx signal is used to drive only a reduced-drive or half-drive signal for a non-SSTL load such as LVTTL. If an SSTL load is to be driven low, the output buffer circuit 204 receives both the active drive signals from FULLDRIVE_PDNx and PDNx. If only a conventional reduced-drive load is to be driven low, the output buffer circuit 204 receives only the active drive signal from PDNx.

The four drive transistors of the output driver circuit 204 are sized to produce the needed drive current according to the load on the output DQPAD. One skilled in the art will recognize that each output data pin of an SDRAM will have a separate set of pre-driver 202 and driver 204 circuits driving each data output pin.

Figure 3:
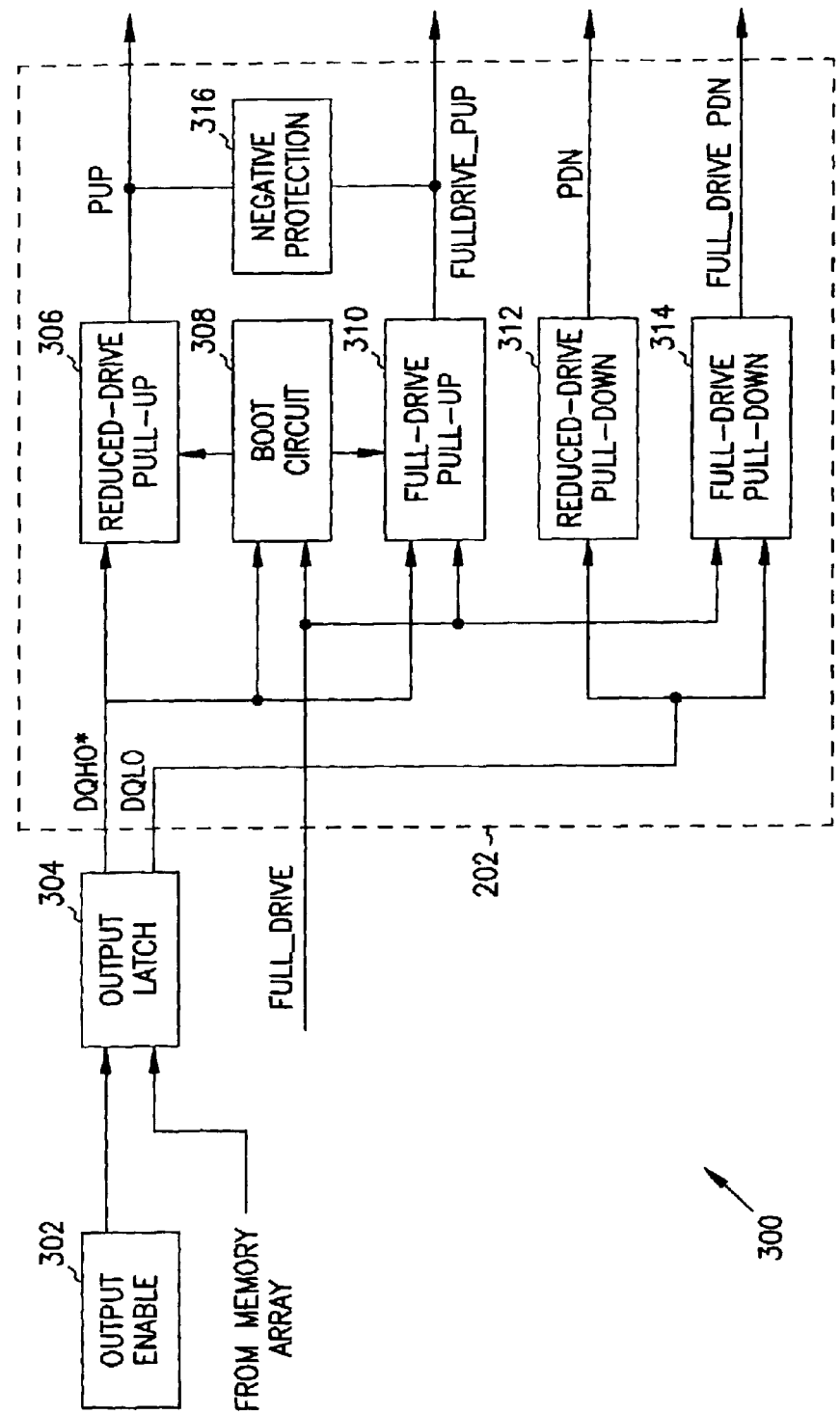
FIG. 3 is a block diagram of a pre-driver circuit of a memory device according to an embodiment of the invention.

FIG. 3 is a block diagram of a pre-driver circuit 202 of a memory device according to an embodiment of the invention as part of a data output path 300 of a memory device. The output data path 300 includes an output enabler 302 which controls whether the data path as a whole would produce a meaningful data signal. If the output enabler 302 enables the data output path such as in a read-data condition of the memory device, then an output latch 304, which is coupled to the output enabler 302, latches the data for the period of time in which valid data is required to be held on a data output pin.

By holding the data bit for a predefined period of time, the output latch 304 frees up internal resources of the memory device, such as multiple direct-current sense amplifiers (not shown), to get additional data for outputting through the output buffer. This is especially important in Double Data-Rate (DDR) memory devices which produce a new data word on the data output pins with every clock edge or clock transition. The output latch 304 produces two primary signals: DQHO* and DQLO. The DQHO* signal represents an active-low data output high signal. This means that whenever this signal is at a low level (active level) the data signal ought to be output at a high level. The DQLO signal represents an active-high data output low signal. This means that whenever this signal is at a high level (active high) the data signal ought to be output at a low level. The output latch 304 presents the DQHO* and DQLO signals to the pre-driver circuit 202.

The output latch 304 presents the DQHO* signal to a boot circuit 308 of the pre-driver circuit. The boot circuit 308 provides a voltage level that is appropriate for a full-drive pull-up mode or a reduced-drive pull-up mode. The boot circuit 308 presents the desired voltage to both the reduced-drive pull-up circuit 306 and the full-drive pull-up 310.

The pre-driver circuit 202 includes a negative protection circuit 316. The negative protection circuit 316 prevents a negative voltage data signal, which is driven from devices outside of the memory device, from inadvertently turning on the output buffer. In other words, several external devices and memory devices share the same bus as the present memory. When those external devices are sending signals on the bus wires, some of those signals may create a momentary negative voltage (below ground level) in response to voltage undershoot or ringing on the bus wires. These spurious voltages may cause the output buffer to inadvertently turn on if there isn't some protection against the negative voltages. As will be described more fully below, the negative voltage protection circuit disables the output drivers and pre-drivers from inadvertently turning on.

The pre-driver circuit 202 includes a reduced-drive pull-down circuit 312 and a full-drive pull-down circuit 314. Both of these pull-down circuits receive the DQLO signal from the output latch 304. Thus, the combination of the pull-up circuits 306 and 310 and the pull-down circuits 312 and 314 allow the output data signal to be driven to a desired logic voltage level, high or low, at an appropriate drive mode, full-drive or reduced-drive.

Figure 4:
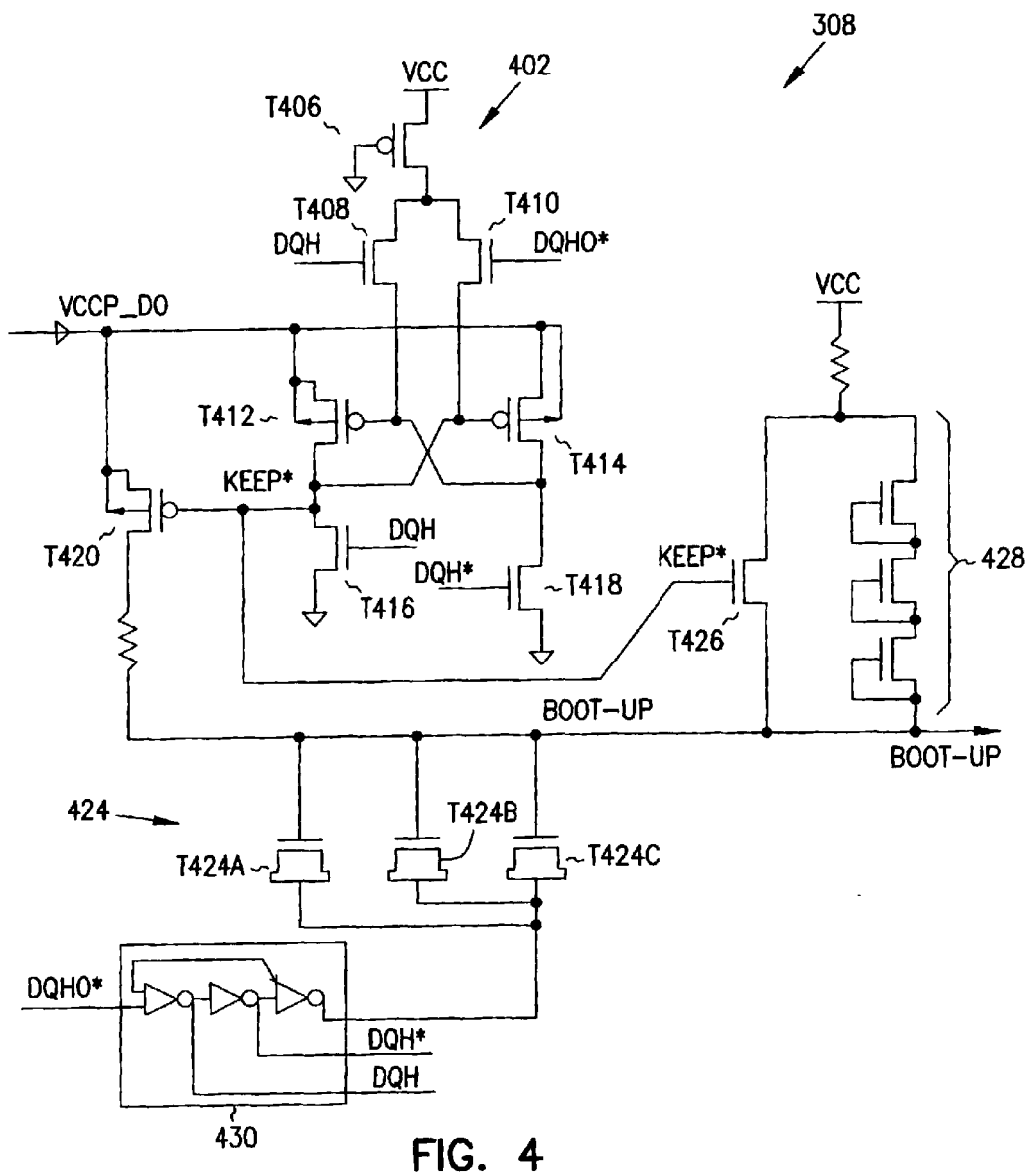
FIG. 4 is a circuit diagram of a boot circuit according to an embodiment of the invention.

FIG. 4 is a circuit diagram of a boot circuit 308 according to an embodiment of the invention. The boot circuit 308 includes an inverter circuit 430 that receives the DQHO* signal and produces three signals: DQHO, DQH and DQH*. The DQH* signal has the same information content as the DQHO* signal except that it is strengthened by the inverter circuit. The DQH signal has the same information content as the DQHO* or the DQH* signal except that its level is inverted with respect to the level of the DQHO* or the DQH* signal. The third signal is simply another inverted DQHO* signal labeled DQHO.

The boot circuit 308 includes a level shifter 402 which will be described by way of its operation. When the DQH* signal is high, this indicates that the reduced-drive mode is desired. With DQH* at a high level, the n-channel transistor T418 pulls the gate of the p-channel transistor T412 to ground, and transistor T412 is turned on. Transistor T414 is turned off because transistor T410 is turned-on due to the high DQHO* signal at the gate of the transistor T410.

With transistor T412 turned on, the node labeled KEEP* is coupled to the supply source VCCP_DQ, which is a pumped voltage bus dedicated for powering the high-current demands of the output driver circuits. The VCCP_DQ pumped voltage level in greater than the Vcc supply levels and is produced in well known fashion using an on-chip voltage pump circuit (not shown). Because KEEP* is high, the transistor T420 remains turned off but transistor T426 is turned on. Because transistor T426 is turned on, the transistor T426 couples the node BOOT_UP to the regular supply voltage Vcc. Thus, in reduced-drive pull-up mode, the BOOT_UP node is coupled to the level of the regular supply voltage Vcc. Also, the set of transistors 428 are wired in a diode configuration to form a diode stack to clamp the voltage level on the BOOT_UP node from rising above Vcc.

Each transistor in the set of transistors 424 has its source coupled to its drain to form a capacitor configuration. When the DQHO* signal is high, the node BOOT_UP is coupled to the supply voltage. Thus, one side of the transistors T424A, T424B, and T424C is coupled to the BOOT_UP supply voltage, but the other side of these capacitor-coupled transistors is coupled to a low voltage because the high DQHO* signal is inverted due to the inverter 430. As will be discussed, when the DQHO* signal goes low, the transistors T424A, T424B, and T424C act as a voltage pump to pump the BOOT_UP node to a pumped voltage.

Recalling that DQH* is a low-active signal such that when the signal DQH* is low, this indicates that output data high is desired. It also means the signal DQH is high. If signal DQH* is low, the transistor T418 is turned off and the transistor T416 is turned on. The transistor T416, being on, couples the node KEEP* to ground. With the node KEEP* at a low level, the transistor T420 turns on. Recall that with the DQH* signal low, the transistors T424A, T424B, and T424C act to pump the BOOT_UP node to a pumped voltage. As the transistor T420 turns on, the node BOOT_UP is clamped to the pumped voltage VCCP_DQ without further assistance from the transistors T424AD, T424B, and T424C.

What has been discussed hereinbefore is that the boot circuit 400 allows the node BOOT_UP to be booted up to a regular supply voltage when output data low is desired or to a pumped supply voltage when output data high is desired. The node BOOT_UP will be shared with other circuits in the pre-driver circuit 202 as discussed hereinbelow.

Figure 5:
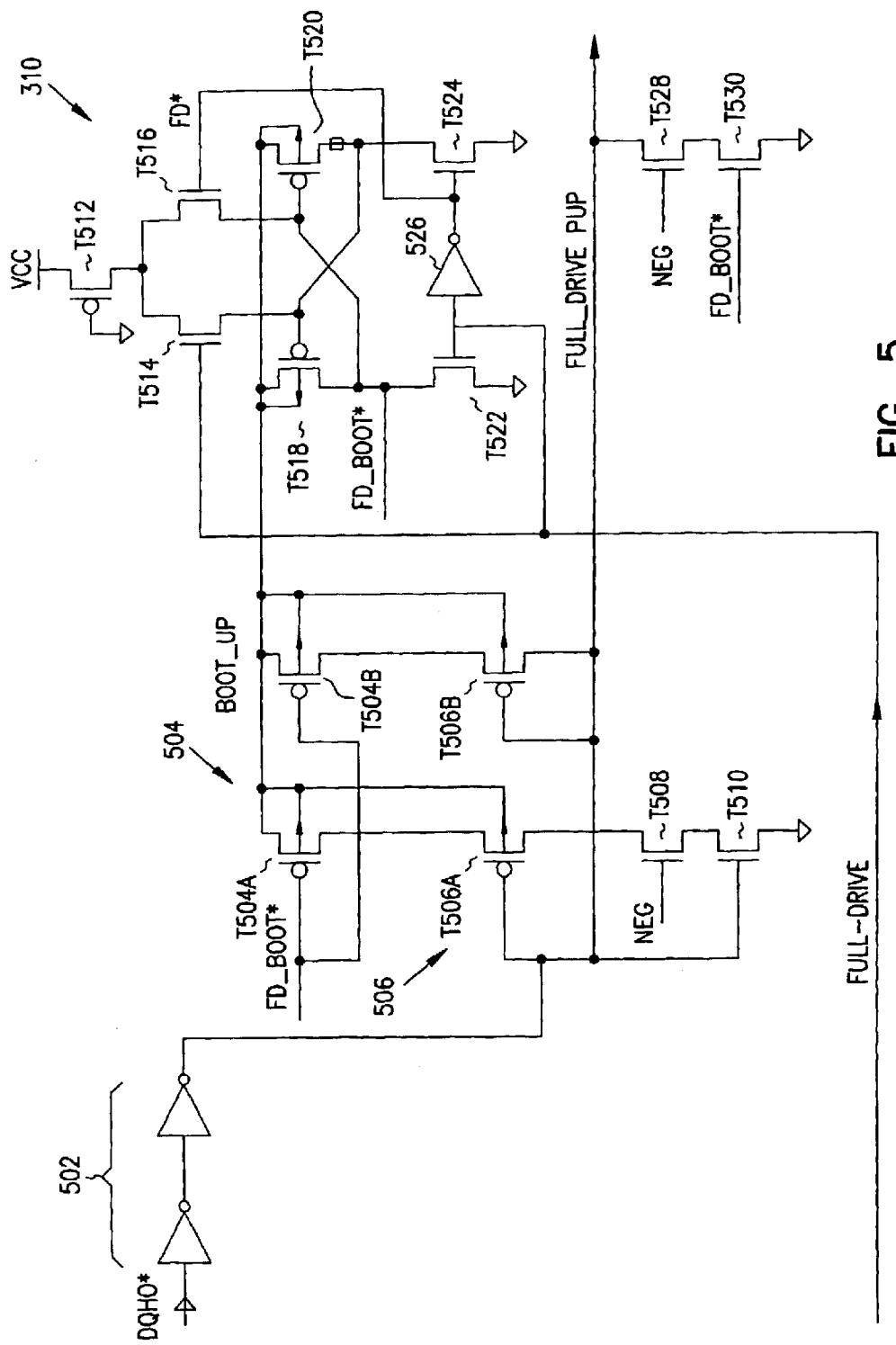
FIG. 5 is a circuit diagram of a circuit to provide a full-drive pull-up mode according to an embodiment of the invention.

FIG. 5 is a detailed schematic circuit diagram of the full-drive pull-up circuit 310 of FIG. 3 and operates to source the output-high signal in full-drive pull-up mode. The circuit 310 is receptive to the FULL-DRIVE signal which indicate the drive mode of the output drivers. If the level of the FULL-DRIVE signal is high, this indicates that full-drive mode on the output pins is desired. If the level is low, then full-drive mode is not desired. The source of the FULL_DRIVE signal can be many things such as an external pin on the memory device, or an internal programmable register. The FULL_DRIVE mode signal may be factory-programmable or programmed in the field. The FULL_DRIVE mode signal may be manually set or may be selected by automatic sensing of the type of connection or termination on the output pins and setting the drive mode accordingly. Those skilled in the art will readily recognize that the FULL_DRIVE signal can be set though a wide variety of manual or automatic means.

When the FULL-DRIVE signal is low, transistor T522 is turned off. Inverter 526 inverts the low FULL-DRIVE signal to present a high signal at the gate of the transistor T524 which will turn on transistor T524. Transistor T524 then pulls the gate of the transistor T518 to ground which will turn on transistor T518. Transistor T518 then couples the node FD_BOOT* to the supply node BOOT_UP, which is high. With FD_BOOT* being high, the set of p-channel transistors 504 will not be turned on. Transistor T530 will be turned on to pull the node FULL-DRIVE PUP to ground thereby disabling the full-drive mode.

Note that transistors T528 and T508 are connected to a NEG signal at the gate. The NEG signal is generated by a negative voltage protection circuit to inhibit the circuit 310 from turning on because of undesired manipulation of an output path by devices external to a memory device. This is described in more detail below in conjunction with the description of the negative voltage protection circuit shown in FIG. 7.

When the FULL-DRIVE signal is high, transistor T522 turns on and transistor T524 turns off. Transistor T522 couples the node FD_BOOT* to ground. With FD_BOOT* at a low level, the set of p-channel transistors 504 turns on to transfer the voltage at the supply node BOOT_UP to each source of each p-channel transistor in the set of p-channel transistors 504.

To enable the full-drive pull-up mode, the pumped voltage at the supply node BOOT_UP should be transferred to the node FULL_DRIVE PUP. For this transfer to be possible, the set of p-channel transistors 506 are turned on and the signal DQHO* is at a low level. A low DQHO* signal will pass through the pair of invertors 502 unchanged in level to turn on p-channel transistors T506A and T506B. When the set of p-channel transistor 506 is turned on, the voltage of the node BOOT_UP at each drain of each transistor 506 is transferred to the node FULL_DRIVE PUP at the source of each transistor. A high DQHO* signal will turn on transistor T510 which couples the node FULL_DRIVE PUP low indicating that no full drive on the output pin is needed.

Figure 6:
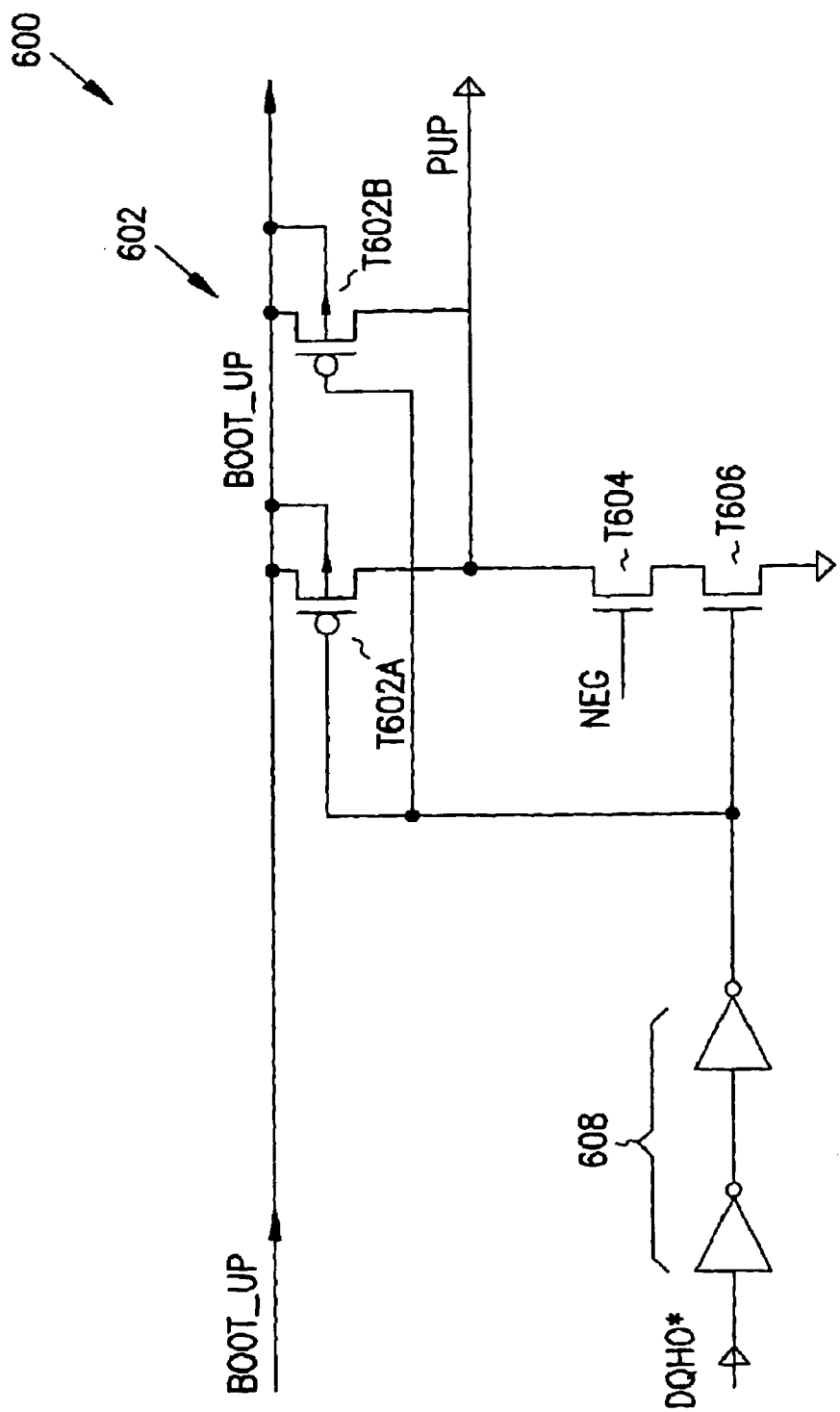
FIG. 6 is a circuit diagram of a circuit to provide a reduced-drive pull-up mode according to an embodiment of the invention.

FIG. 6 is a schematic diagram of the reduced drive pull up circuit 306 to provide a reduced-drive pull-up mode signal. The reduced drive pull up circuit 306 is receptive to the DQHO* signal and the BOOT_UP supply voltage. If the DQHO* signal is low, the set of invertors 608 allows the signal to pass unchanged. When a low DQHO* signal is presented at each gate of each transistor of the set of transistors 602, the voltage at the supply node BOOT_UP is presented to the node PUP.

The gate of the transistor 604 couples to a signal NEG. The signal NEG is normally at a high level to turn on the transistor T604. The signal NEG becomes low to turn off the transistor T604 only when a negative voltage was detected on the output pin as described below. If the signal DQHO* is high, the transistor T606 will turn on and couple the node signal PUP to ground.

Figure 7:
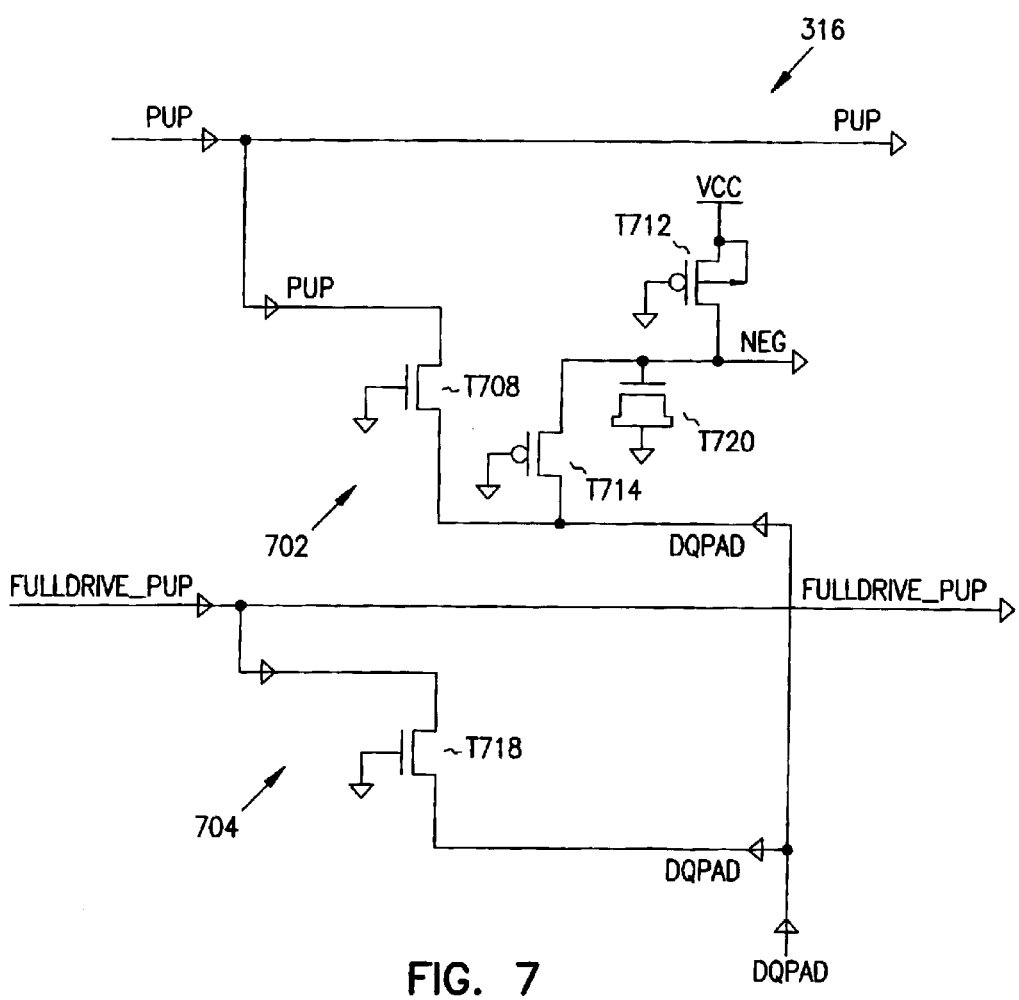
FIG. 7 is a circuit diagram of a circuit to provide negative voltage protection according to an embodiment of the invention.

FIG. 7 is a circuit diagram of a circuit to provide negative voltage protection according to an embodiment of the invention. Negative voltage protection circuit 316 includes a negative voltage protection subcircuit 702 for the reduced-drive pull-up circuit 306 and a negative voltage protection subcircuit 704 for the full-drive pull-up circuit 310. The wire DqxPAD is a sense line connected to the data output pin on the memory device to which other external devices are connected via a databus. The data bus may be driven by other memory devices operating as drivers or sources of voltage while devices such as memory controllers or microprocessors may be connected to the data bus to receive or sink voltage. The possibility exists, therefore, for the voltage on a data bus line to momentarily become negative from ringing or undershoot on a low-going signal driver. Without proper protection against such negative voltages, the circuits internal to the memory device may inadvertently turn on. The protection against these negative voltages is shown in FIG. 7.

In the negative voltage protection subcircuit 702, when the signal DQxPAD becomes negative it will turn on transistors T708 and T714. Transistor T708 allows the signal PUP to follow the signal DQxPAD when it is negative enough to turn on transistor T708. A negative voltage PUP signal will turn off an output driver as will be discussed. The transistor T714 will also allow the NEG signal to follow the negative DQxPAD signal. The NEG signal will turn off various circuits internal to the pre-driver circuit of the memory device so as to inhibit undesired results. Transistor T712 normally would couple the NEG signal high when the DQxPAD signal is not negative enough to turn on transistor T714.

In the negative voltage protection subcircuit 704, when the signal DQxPAD becomes negative, it will turn on transistor T718 to allow the FULL_DRIVE PUP signal to follow the negative DQxPAD signal. A negative FULL_DRUVE PUP signal would turn off a portion of the output buffer.

Figure 8:
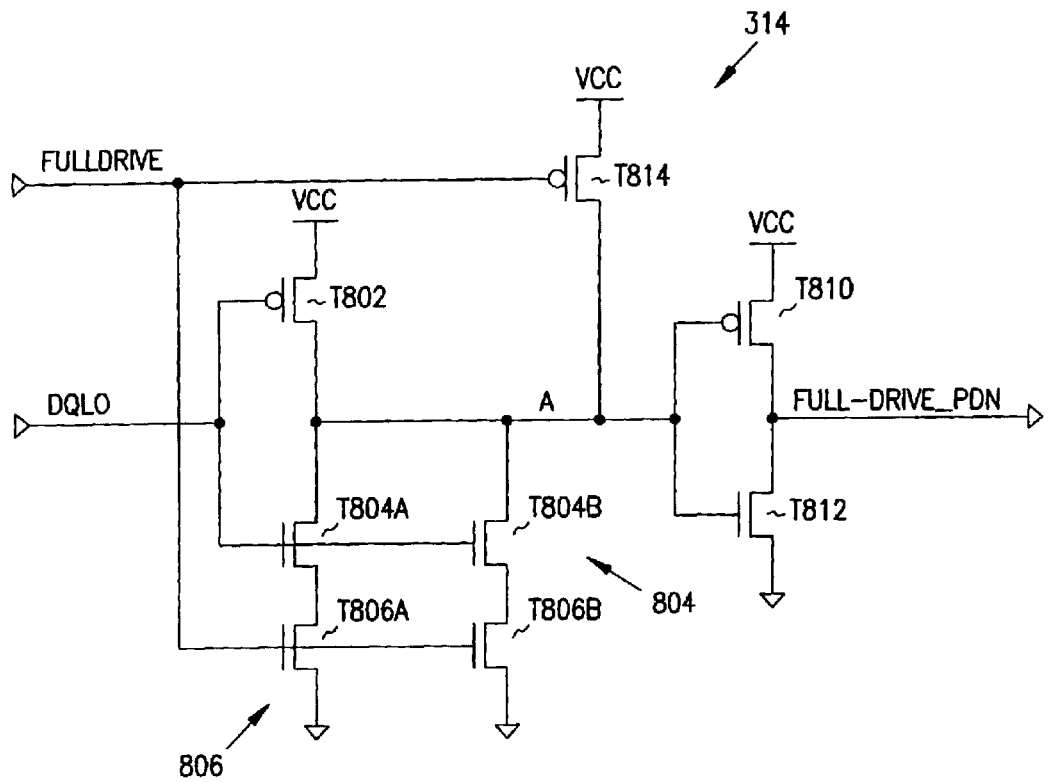
FIG. 8 is a circuit diagram of a circuit to provide full-drive pull-down mode according to an embodiment of the invention.

FIG. 8 is a schematic diagram of the full-drive pull-down circuit 314 used to indicate the full-drive pull-down mode according to an embodiment of the invention. When both the FULL_DRIVE signal and the DQLO signal are at a high level, the node A will be pulled to ground. More specifically, when the FULL_DRIVE signal is high, transistor T814 is turned off and the set of n-channel transistors 806 will be turned on. When the DQLO signal is also high, transistor T802 is turned off and the set of n-channel transistors 804 will be turned on. With both sets of n-channel transistors 804 and 806 turned on, the node A is pulled to ground. With node A at ground, the n-channel transistor T812 is turned off and the p-channel transistor 810 is turned on. Transistor T810 couples the node PDN to the supply voltage, which is at a high level.

When either the FULL_DRIVE signal or the DQLO signal is low, the node A is at a high level. More specifically, when the FULL_DRIVE signal is low, the transistor T814 is turned on and the set of n-channel transistors 806 is turned off. Transistor T814 couples the node A to the voltage supply Vcc. When the DQLO signal is low, transistor T802 is turned on and the set of n-channel transistors 804 is turned off. Transistor T802 couples the node A to the voltage supply Vcc. When the node A is at a high level as being coupled to the voltage supply, transistor T812 is turned on and the p-channel transistor 810 is turned off. The transistor T812 couples the node PDN to ground.

What has been shown hereinbefore is that to enable the full-drive pull-down mode, both the FULL_DRIVE signal and the DQLO signal should be at a high level. To disable the full-drive pull-down mode, either the FULL-DRIVE signal or the DQLO signal can be at a low level.

Figure 9:
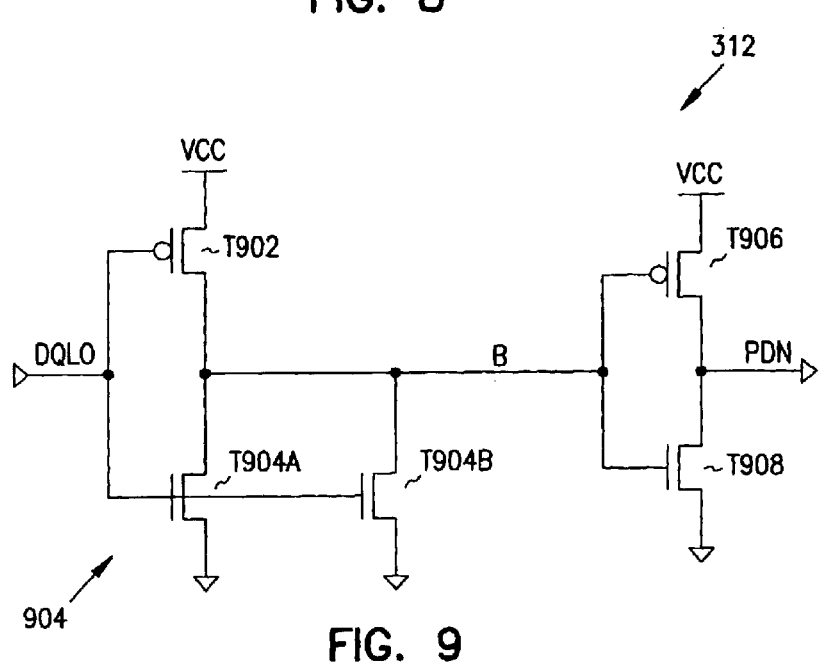
FIG. 9 is a circuit diagram of a circuit to provide reduced-drive pull-down mode according to an embodiment of the invention.

FIG. 9 is a schematic diagram of the reduced drive pull-down circuit 312 which operates on reduced-drive pull-down mode according to an embodiment of the invention. Circuit 312 is receptive to the DQLO signal and produces the PDN signal.

When the DQLO signal is low, transistor T902 is turned on and the set of n-channel transistors 904 is turned off. Transistor T902 will then couple the node B to the voltage supply Vcc. With node B at a high level, transistor T908 is turned on and the p-channel transistor 906 is turned off. When transistor T908 is turned on, the node PDN couples to ground.

When the DQLO signal is high, transistor T902 is turned off and the set of n-channel transistors 904 is turned on. The set of n-channel transistors 904 couples the node B to ground. When the node B is at ground, transistor T908 is turned off and the p-channel transistor 906 is turned on. The p-channel transistor 906 couples the node PDN to the voltage supply, which is at a high level.

What has been shown hereinbefore is that to enable the reduced-drive pull-down mode, the DQLO signal should be high. To disable the reduced-drive pull-down mode, the DQLO signal should be low.

Figure 10:
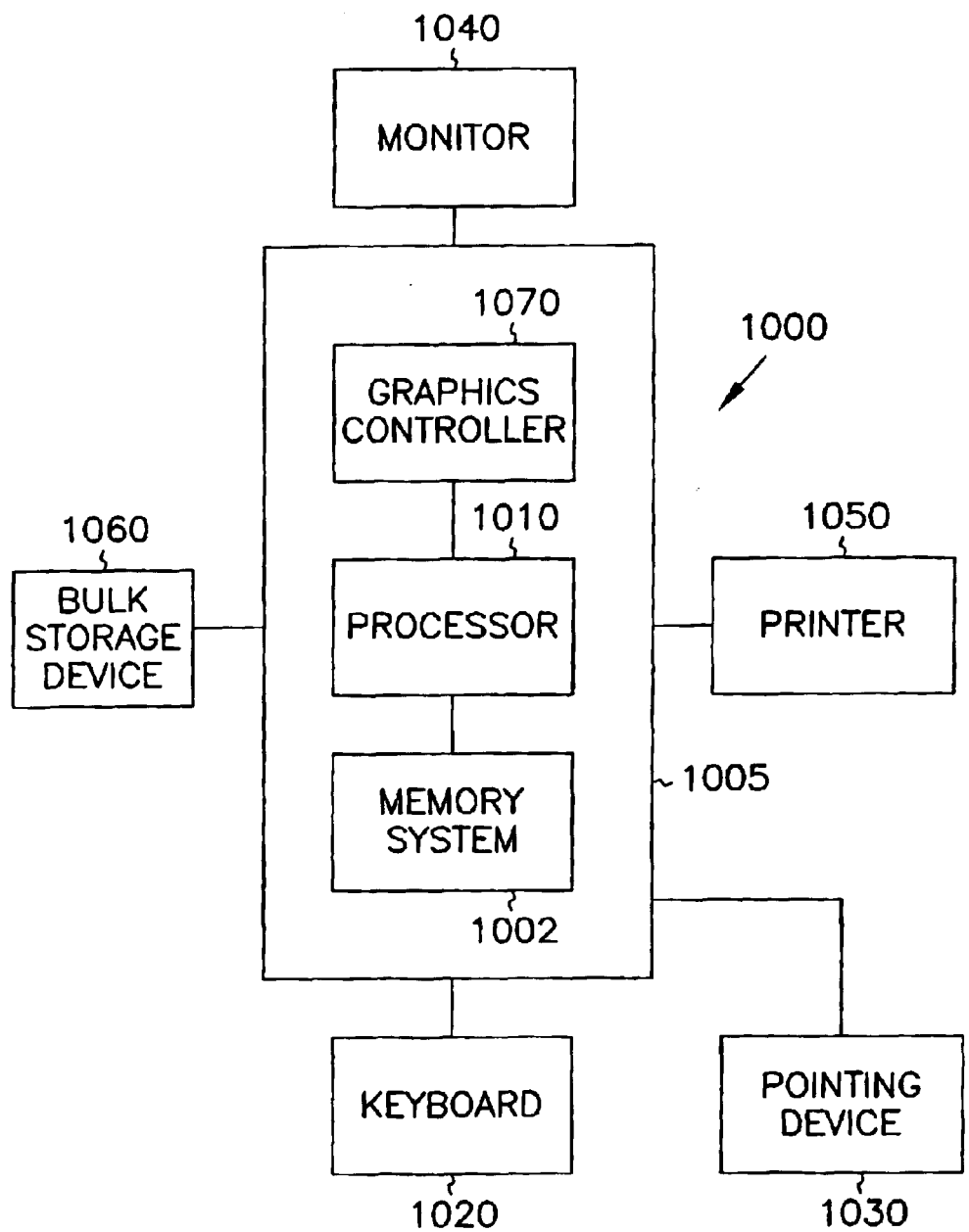
FIG. 10 is a block diagram of a system containing a memory device according to one embodiment of the present invention.

FIG. 10 is a block diagram of a system according to one embodiment of the present invention. Computer system 1000 contains a processor 1010 and a memory system 1002 housed in a computer unit 1005. Computer system 1000 is but one example of an electronic system containing another electronic system, e.g., memory system 1002, as a subcomponent. The memory system 1002 includes a memory device that includes the multiple-mode output driver as discussed in various embodiments of the present invention. Computer system 1000 optionally contains user interface components. These user interface components include a keyboard 1020, a pointing device 1030, a monitor 1040, a printer 1050, and a bulk storage device 1060. It will be appreciated that other components are often associated with computer system 1000 such as modems, device driver cards, additional storage devices, etc. It will further be appreciated that the processor 1010 and memory system 1002 of computer system 1000 can be incorporated on a single integrated circuit. Such single-package processing units reduce the communication time between the processor and the memory circuit. Any of these components of the system may contain a memory device that includes the multiple-mode output driver of the present invention. This is particularly true of a graphics subsystem 1070 of FIG. 10 utilizing SGRAM that includes the multiple-mode output driver as discussed in various embodiments of the present invention.

Figure 11:
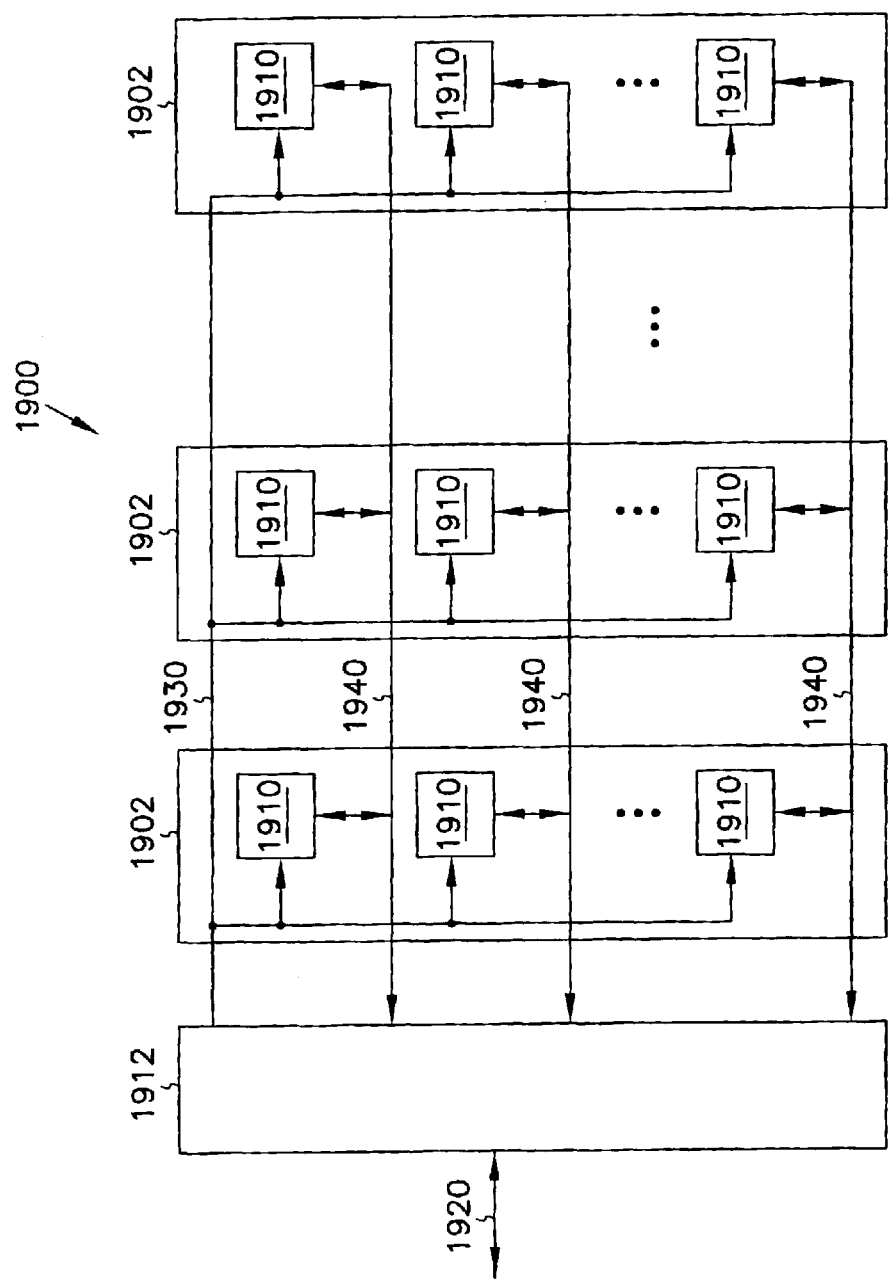
FIG. 11 is a block diagram of a system containing and integrated circuit having a multiple mode driver according to one embodiment of the present invention.

FIG. 11 is a block diagram of a system according to one embodiment of the present invention. Memory system 1900 contains one or more memory modules 1902 and a memory controller 1912. Each memory module 1902 includes at least one memory device 1910. Memory controller 1912 provides and controls a bidirectional interface between memory system 1900 and an external system bus 1920. Memory system 1900 accepts a command signal from the external bus 1920 and relays it to the one or more memory modules 1902 on a command link 1930. Memory system 1900 provides for data input and data output between the one or more memory modules 1902 and external system bus 1920 on data links 1940. At least one of the memory devices 1910 includes the multiple-mode output driver as discussed in various embodiments of the present invention.

Conclusion

It will be understood by those skilled in the art that the circuits and signals described above in the various embodiments of the present invention are illustrative and that their implementation can take on many variations without departing from the spirit and scope of the claimed invention. For example, although some signals such as DQHO* have been described as active-low or low-active (they indicate an active or an ON state with a low or zero voltage), one skilled in the art will readily recognize that this is a design convention which is a matter of choice and convenience and that active-high signals may be substituted therefor. In a similar fashion, active-high signals (where the active or the ON state is indicated by a high or non-zero voltage) are also readily substitutable for active-low signals. Thus, negative or positive logic conventions, active-high or active-low signals, positive or negative voltages, p-channel or n-channel transistors, and many other complementary systems may be used with the present invention without departing from the claimed invention or limiting the equivalents of the present invention.

It will further be understood that the above description of a SDRAM (Synchronous Dynamic Random Access Memory) is intended to provide a general understanding of the memory device and is not a complete description of all the elements and features of a SDRAM. Further, the invention is equally applicable to any size and type of memory circuit and is not intended to be limited to the SDRAM described above. Other alternative types of devices include DRAM (Dynamic Random Access Memory), SRAM (Static Random Access Memory) or Flash memories. Additionally, the memory device could be SGRAM (Synchronous Graphics Random Access Memory), SDRAM II, and DDR SDRAM (Double Data Rate SDRAM), as well as Synchlink or Rambus DRAMs and other emerging memory technologies.

Figure 12:
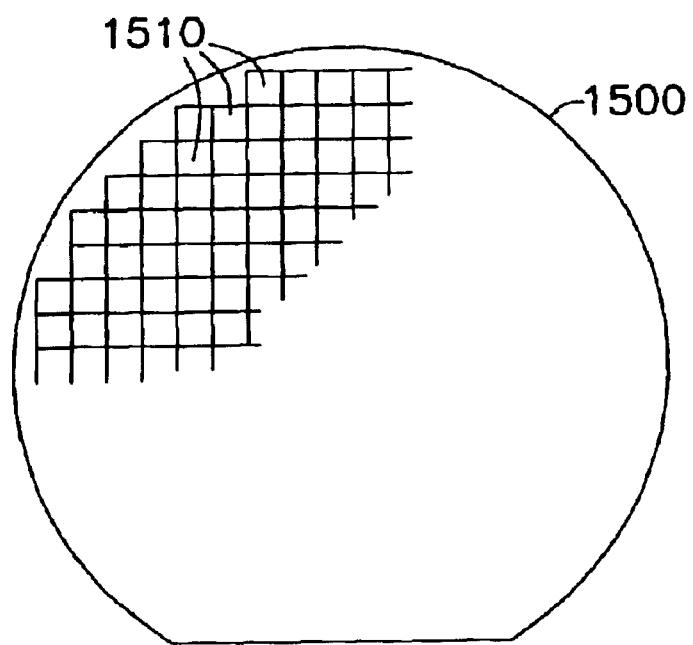
FIG. 12 is an elevation view of a semiconductor wafer according to one embodiment of the present invention.
Figure 2:
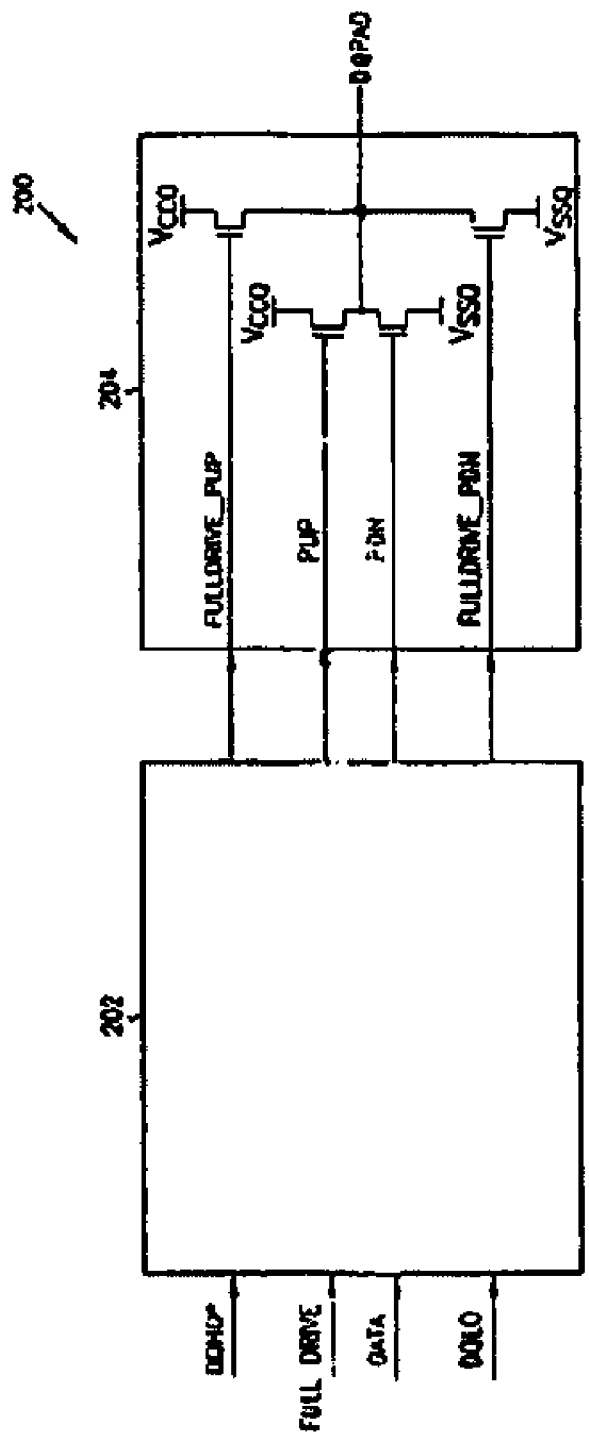

As recognized by those skilled in the art, memory devices of the type described herein are generally fabricated as an integrated circuit containing a variety of semiconductor devices as shown in FIG. 12. The integrated circuit is supported by a substrate 1500. Integrated circuits are typically repeated multiple times on each substrate 1510. The substrate is further processed to separate the integrated circuits into dies as is well known in the art.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

What is claimed is:

1. An output driver having two modes, comprising:
   a first circuit to support one of the two modes, wherein the one of the two modes drives a subsequent input stage of another circuit with a termination in between the output driver and the subsequent input stage of the another circuit, and in response to a pumped voltage level to produce full-drive power; and
   a second circuit to support the other of the two modes, wherein the other of the two modes drives the subsequent input stage of the another circuit without the termination in between the output driver and the subsequent input stage of the another circuit with a reduced drive power.

2. The output driver of claim 1, wherein the second circuit drives a range that is less powerful than a range used for the first circuit so as to inhibit undesired ringing and noise.

3. The output driver of claim 1, wherein the second circuit drivers a range that is compatible with point-to-point connection between the output driver and the subsequent input stage of the another circuit.

4. The output driver of claim 1, wherein the first circuit drives the subsequent input stage of the another circuit to a desired voltage level from a termination voltage that appears over the termination, wherein the one of the two modes, which is supported by the first circuit, defines a stub series terminated load specification so as to inhibit noise.

5. The output driver of claim 1, wherein the first circuit drives a range that swings between +380 millivolts and −380 millivolts with respect to the termination voltage.

6. An output driver for driving data at an output, comprising:
   a full-drive pull-up circuit to drive output data high to a full power level in response to a pumped suuply voltage;
   a reduced-drive pull-up circuit to drive output data high at a reduced level;
   a full-drive pull-down circuit to drive output data low to a full level; and
   a reduced-drive pull-down circuit to drive output data low at a reduced level.

7. The output driver of claim 6, wherein the full-drive pull-up circuit is receptive to a full-drive pull-up signal and a power supply signal, and wherein when the full-drive pull-up signal is active, the output driver drives data at the output in a full-drive mode.

8. The output driver of claim 6, wherein the reduced-drive pull-up circuit is receptive to a reduced-drive pull-up signal and a power supply signal, and wherein when the reduced-drive pull-up signal is active, the output driver drives data at the output in a reduced-drive mode.

9. The output driver of claim 6, wherein the full-drive pull-down circuit is receptive to a full-drive pull-down signal and a power supply signal, and wherein when the full-drive pull-down signal is active, the output driver drives data at the output in a full-drive mode.

10. The output driver of claim 6, wherein the reduced-drive pull-down circuit is receptive to a reduced-drive pull-down signal and a power supply signal, and wherein when the reduced-drive pull-down signal is active, the output driver drives data at the output in a reduced-drive mode.

11. A driver for drivina data at an output comprising an output driver wherein the output driver comprises:
   a full-drive pull-up circuit to drive output data hinh to a full level;
   a reduced-drive pull-up circuit to drive output data high at a reduced level;
   a full-drive pull-down circuit to drive output data low to a full level;
   a reduced-drive pull-down circuit to drive output data low at a reduced level;
   wherein the driver further comprises pre-driver circuit that drives the output driver and produces a mode selected from a group consisting of a full-drive mode and a reduced-drive mode wherein the full drive mode is indicated by a pumped voltage level and the reduced drive mode is indicated by a supply voltage level.

12. The driver of claim 11, wherein the pre-driver circuit includes a boot circuit, which is shared between the full-drive mode and the reduced-drive mode, so as to provide the mode that is produced by the output driver.

13. The driver of claim 11, wherein the pre-driver circuit includes a set of reduced-strength drivers, wherein the set of reduced-strength drivers includes a reduced-strength pull-up driver and a reduced-strength pull-down driver.

14. The driver of claim 11, wherein the pre-driver circuit includes a set of full-strength drivers, wherein the set of full-strength drivers includes a full-strength pull-up driver and a full-strength pull-down driver.

15. The driver of claim 11, wherein the pre-driver circuit includes a negative protection circuit that inhibits the undesired turning-on of the output driver.

16. An output driver having two modes, comprising:
   a pre-driver circuit that produces a mode signal selected from a group consisting of a full-drive mode and a reduced-drive mode wherein the full drive mode is indicated by a pumped voltage level and the reduced drive mode is indicated by a supply voltage level; and an output driver coupled to the pre-driver circuit that outputs a data signal in accordance with the mode produced by the pre-driver circuit wherein the output driver includes:

a reduced-drive pull-up circuit to drive output data high at a reduced level in the reduced drive mode;

a full-drive pull-up circuit to drive output data high to a full level in the full drive mode;

a reduced-drive pull-down circuit to drive output data low at a reduced level in the full drive mode; and a full-drive pull-down circuit to drive output data low to a full level in the full drive mode.

17. The output driver of claim 16, wherein the pre-driver circuit includes a negative protection circuit which inhibits undesired turning-on of the output driver when the mode signal is in the reduced-drive mode, wherein the negative protection circuit includes a first device that allows the mode signal to mirror the data signal when the data signal is negative.

18. The output driver of claim 17, wherein the negative protection circuit includes a second device that produces a signal to turn off the pre-driver circuit when the data signal is negative.

19. The output driver of claim 18, wherein the second device includes an n-channel transistor having a gate, a drain, and a source, wherein the gate couples to ground, wherein the dram outputs the signal, and wherein the source couples to the data signal.

20. The output driver of claim 17, wherein the negative protection circuit inhibits undesired turning-on of the output driver when the mode signal is in the full-drive mode, wherein the negative protection circuit includes a second device that allows the mode signal to mirror the data signal when the data signal is negative.

21. An output driver having two modes, comprising:

a pre-driver circuit that produces a mode signal selected from a group consisting of a full-drive mode and a reduced-drive mode, wherein the pre-driver circuit includes a booting circuit that boots a boot-up signal to a voltage level, wherein the voltage level is selected from a regular voltage supply level or a pumped voltage supply level; and an output driver coupled to the pre-driver circuit that outputs a data signal in accordance with the mode produced by the pre-driver circuit wherein the output driver includes:

a reduced-drive pull-up circuit to drive output data high at a reduced power level in the reduced drive mode;

a full-drive pull-up circuit operating in parallel with the reduced-drive pull-up circuit to drive output data high to a full power level in the full drive mode;

a reduced-drive pull-down circuit to drive output data low at a reduced level in the full drive mode; and a full-drive null-down circuit operating in parallel with the reduced-drive pull-down circuit to drive output data low to a full level in the full drive mode.

22. The output driver of claim 21, wherein the booting circuit includes a level shifter, wherein the level shifter is receptive to a data output high signal to produce a booting signal, wherein when the data output high signal is inactive, the booting signal is high, and wherein when the data output high signal is inactive, the booting signal is low.

23. The output driver of claim 22, wherein the booting circuit includes a first switch, wherein the first switch switches the boot-up signal to the regular voltage supply level when the booting signal is inactive.

24. The output driver of claim 22, wherein the booting circuit includes a second switch, wherein the second switch clamps the boot-up signal to the pumped voltage supply level when the booting signal is active.

25. The output driver of claim 24, wherein the booting circuit includes a set of pumps to pump the boot-up signal to a pumped voltage before the boot-up signal is clamped by the second switch to the pumped voltage supply level.

26. An output driver having two modes to outputdata in a memory device, comprising:

a pre-driver circuit that produces a mode signal selected from a group consisting of a full-drive mode and a reduced-drive mode, and an output driver coupled to the pre-driver circuit that outputs a data signal in accordance with the mode produced by the pre-driver circuit wherein the output driver includes:

a reduced-drive pull-up circuit to drive output data high at a reduced power level in the reduced drive mode;

a full-drive pull-up circuit operating in parallel with the reduced-drive pull-up circuit to drive output data high to a full power level in the full drive mode in response to a pumped supply voltage;

a reduced-drive pull-down circuit to drive output data low at a reduced level in the full drive mode; and a full-drive pull-down circuit operating in parallel with the reduced-drive pull-down circuit to drive output data low to a full level in the full drive mode.

27. The output driver of claim 26, wherein the reduced-drive pull-up driver includes a switch that couples the reduced-drive node to ground when a data output high signal is inactive.

28. The output driver of claim 27, wherein the switch includes a p-channel transistor having a gate, a drain, and a source, wherein the gate of the p-channel transistor couples to the data output high signal, wherein the drain of the p-channel transistor couples to the voltage supply, wherein the source of the p-channel transistor couples to the reduced-drive node, and wherein the switch includes an n-channel transistor having a gate, a drain, and a source, wherein the gate of the n-channel transistor couples to the data output high signal, wherein the drain of the n-channel transistor couples to the reduced-drive node, and wherein the source of the second n-channel transistor couples to ground.

29. The output driver of claim 26, wherein the reduced-drive pull-up driver includes an inverter that is receptive to the data output high signal and the reduced-drive pull-up driver is receptive to a boot-up signal, wherein the boot-up signal is at a pumped voltage level when the data output high signal is active, and wherein the inverter couples the reduce-drive mode to the boot-up signal when the data output high signal is active.

30. The output driver of claim 29, wherein the inverter includes a p-channel transistor, wherein the p-channel transistor includes a gate, a drain, and a source, wherein the gate of the p-channel transistor couples to the data output high signal, wherein the drain of the p-channel transistor couples to the boot-up signal, and wherein the source of the p-channel transistor couples to the reduced-drive node.

31. An output driver having two drive modes, comprising:
a first circuit to support one of the two modes, wherein the one of the two modes drives a subsequent terminated input stage of another circuit in response to a pumped supply voltage driving the first circuit; and a second circuit to support the other of the two modes, wherein the other of the two modes drives the subsequent unterminated input stage of the another circuit in response to a supply voltage driving the second circuit.

32. The output driver of claim 31, wherein the second drive circuit drives a range that is less powerful than a range used for the first drive circuit so as to inhibit undesired ringing and noise.

33. An output driver for driving data at an output, comprising:

a full-drive pull-up circuit to drive output data high to a full power level in response to a pumped supply voltage level;

a reduced-drive pull-up circuit to drive output data high at a reduced power level in response to a supply voltage level;

a full-drive pull-down circuit to drive output data low to a full level; and a reduced-drive pull-down circuit to drive output data low at a reduced level.

* * * * *

UNITED STATES PATENT AND TRADEMARK OFFICE
CERTIFICATE OF CORRECTION

PATENT NO. : 6,885,226 B2
DATED : April 26, 2005
INVENTOR(S) : Waldrop

It is certified that error appears in the above-identified patent and that said Letters Patent is hereby corrected as shown below:

Title page,
Item [56], References Cited, U.S. PATENT DOCUMENTS, delete "327/111" and insert -- 327/11 --, therefor.

Delete Drawing Sheet 2 and substitute therefor the Drawing Sheet consisting of Fig. 2 as shown on the attached page.

Column 4,
Line 16, delete "10" and insert -- 110 --, therefor.

Column 9,
Lines 14-15, delete "FULL_DRUVE" and insert -- FULL_DRIVE --, therefor.

Column 12,
Line 4, delete "suuply" and insert -- supply --, therefor.
Line 34, delete "drivina" and insert -- driving --, therefor.
Line 36, delete "hinh" and insert -- high --, therefor.
Line 44, after "comprises" insert -- a --.

Column 13,
Line 29, delete "dram" and insert -- drain --, therefor.
Line 57, delete "null-down" and insert -- pull-down --.

Column 14,
Line 12, delete "outputdata" and insert -- output data --, therefor.

Signed and Sealed this

Twenty-sixth Day of July, 2005

JON W. DUDAS
*Director of the United States Patent and Trademark Office*